(12) United States Patent
Aponte Luis

(10) Patent No.: US 11,867,863 B2
(45) Date of Patent: Jan. 9, 2024

(54) DEVICE TO MEASURE DISRUPTIONS IN A CONTROLLED MAGNETIC FIELD

(71) Applicant: Ontech Security, S.L., La Rinconada (ES)

(72) Inventor: Juan Aponte Luis, La Rinconada (ES)

(73) Assignee: ONTECH SECURITY, S.L., La Rinconda (ES)

( * ) Notice: Subject to any disclaimer, the term of this patent is extended or adjusted under 35 U.S.C. 154(b) by 593 days.

(21) Appl. No.: 17/046,966

(22) PCT Filed: Apr. 13, 2019

(86) PCT No.: PCT/EP2019/059585
§ 371 (c)(1),
(2) Date: Oct. 12, 2020

(87) PCT Pub. No.: WO2019/197677
PCT Pub. Date: Oct. 17, 2019

(65) Prior Publication Data
US 2021/0157024 A1 May 27, 2021

(30) Foreign Application Priority Data
Apr. 13, 2018 (EP) ..................................... 18382251

(51) Int. Cl.
*G01R 33/00* (2006.01)
*G01V 3/08* (2006.01)
(Continued)

(52) U.S. Cl.
CPC .............. *G01V 3/08* (2013.01); *G01R 33/02* (2013.01); *G01R 33/028* (2013.01);
(Continued)

(58) Field of Classification Search
CPC . G01V 3/08; G01V 3/081; G01V 3/15; G08B 13/24; G08B 13/2491;
(Continued)

(56) References Cited

U.S. PATENT DOCUMENTS 5,764,145 A 6/1998 Hansson et al.
2005/0261865 A1* 11/2005 Gibb .................... H03K 17/955
702/127

(Continued)

FOREIGN PATENT DOCUMENTS

EP 0522949 A1 1/1993
FR 2274174 A1 1/1976

*Primary Examiner* — Raul J Rios Russo
(74) *Attorney, Agent, or Firm* — TAROLLI, SUNDHEIM, COVELL & TUMMINO L.L.P.

(57) ABSTRACT

A device for measuring disruptions in a controlled magnetic field and generated by the device itself surrounding a sole conductive element, antenna or electrode and comprising, at least: a controlled magnetic field sensor comprising, in turn, an oscillator circuit connected to at least one electrode, a digital module; and a processor connected to the digital module. The applications of the device that is the object of the invention are all those requiring the detection of an object prior to it resulting in the violation of the restricted space. Amongst these applications we can highlight the following: the localisation of people, industrial security applications, robotics, domestic security applications, military applications and vehicle security applications.

14 Claims, 6 Drawing Sheets

(51) Int. Cl.
  *G08B 13/24* (2006.01)
  *H03K 17/95* (2006.01)
  *G01R 33/02* (2006.01)
  *G01R 33/09* (2006.01)
  *G01R 33/028* (2006.01)
  *G01V 3/15* (2006.01)

(52) U.S. Cl.
  CPC ........... *G01R 33/093* (2013.01); *G08B 13/24* (2013.01); *H03K 17/9532* (2013.01); *G01V 3/081* (2013.01); *G01V 3/15* (2013.01)

(58) Field of Classification Search
  CPC ... H03K 17/9532; H03K 2217/960765; H03K 17/955; G01D 21/00; G01R 33/02; G01R 33/093; G01R 33/028
  USPC ............ 324/51, 55, 200, 213, 214, 220, 260
  See application file for complete search history.

(56) References Cited

U.S. PATENT DOCUMENTS

2014/0292306 A1* 10/2014 Prance ................... G01V 3/088
                                                    324/123 R
2019/0115918 A1*  4/2019 Lotz ................... H03K 17/9537
2020/0136617 A1*  4/2020 Kühn ................. H03K 17/9547

* cited by examiner

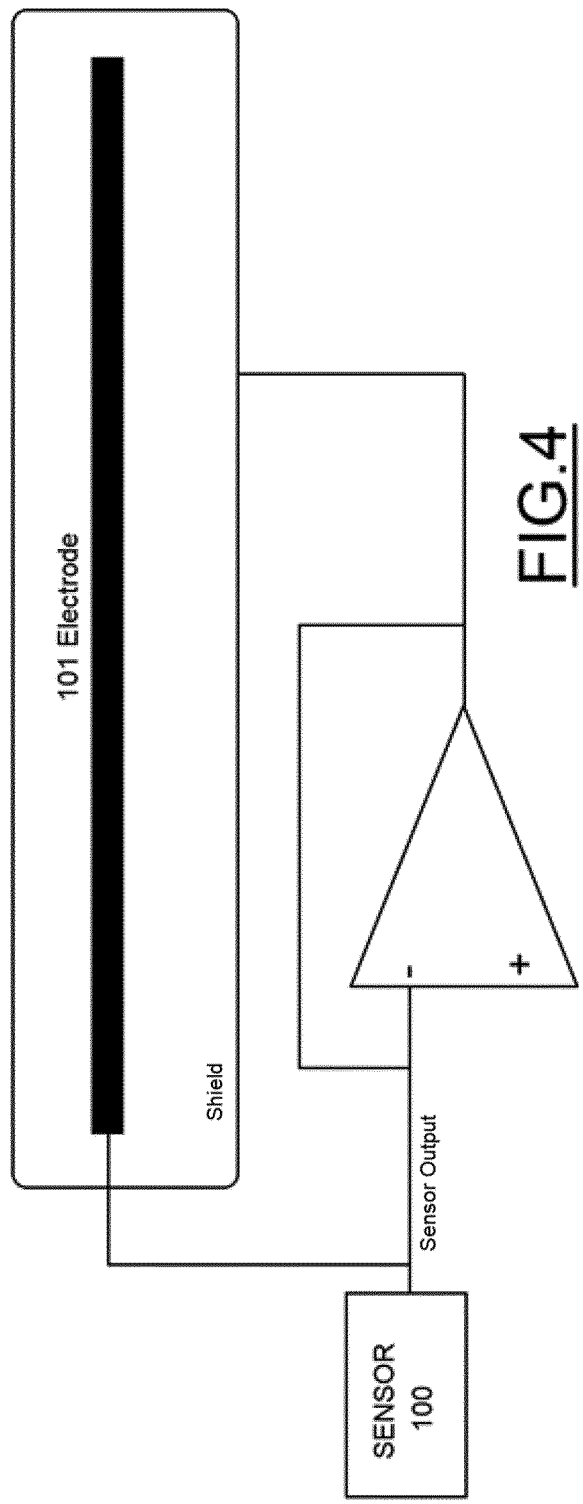

DEVICE TO MEASURE DISRUPTIONS IN A CONTROLLED MAGNETIC FIELD

RELATED APPLICATIONS

The present invention is a U.S. National Stage under 35 USC 371 patent application, claiming priority to Serial No. PCT/EP2019/059585, filed on 13 Apr. 2019; which claims priority of EP 18382251.9, filed on 13 Apr. 2018, the entirety of both of which are incorporated herein by reference.

This invention refers to a device comprising a controlled magnetic field (CMF controlled magnetic field) sensor physically integrated in an ASIC (Application-Specific Integrated Circuit). Another object of this invention is a method to measure electromagnetic fields surrounding a conductor, as well as a plurality of uses for the sensor in different technical applications, such as the localisation of people, domestic and industrial security applications, robotics, military applications and security applications for transporting cargo and people, work-related and domestic prevention and security applications and applications for the logistics sector.

BACKGROUND OF THE INVENTION

When an electric charge moves over a conductor it creates an EM field around it. The oscillation of the source charge generates a wave that radiates energy from said conductor, the EM field being the means that enables said energy to be transported remotely from its emitter.

An electromagnetic wave is an electric field and another magnetic one coupled together that oscillate at the same frequency as the electric source charge. At a short distance from the emitter, both fields are independent, but in the far-field zone both are coupled and, by knowing one, the value of the other can be determined.

In the known state of the art, capacitive sensors have been widely used in different applications, such as controlling the level of a fluid inside a container, controlling the fill-level and position of objects or counting materials on conveyor belts. In another type of application related to the medical sector, these types of sensors have also been used to measure intraocular pressure, intracranial pressure, diagnosing pulmonary diseases or measuring the respiratory system.

Within capacitive sensors, capacitive systems based on an oscillator are known wherein the oscillation frequency is used as a parameter to determine the value of the capacity to be measured. Of the different types of oscillators that exist, however, the oscillator used in applications like the one described in this invention must resolve two technical problems:

a) Frequency sensitivity must be high with regard to small variations in the capacity to be measured. This question is very important because when an object approaches the sensor, a disruption of the EM field generated by the sensor will occur and this small variation generated in the field is of vital importance in determining how far away the object is.

b) That the oscillator generates a stable frequency when faced with phenomena such as vibrations, temperature changes and, ultimately, any possible interference regarding the sensor.

The basic principles of the detection and use of disruptions in electromagnetic fields for the detection of people are described, for example, in document GB1404838. According to this invention, an alarm system comprising at least one ultra-high frequency (UHF) oscillator circuit, at least one electromagnetic wave radiation element connected to the oscillator circuit in order to irradiate ultra-high frequency electromagnetic radiation are provided wherein each one of said electromagnetic wave radiation elements is arranged so that movement in the vicinity of the element produces a very low frequency variation in the impedance of the ultra-high frequency of the element and, therefore, a very low frequency variation in the oscillation frequency of the oscillator circuit.

In the systems known in the state of the art, LC-type sine wave oscillators, a generic diagram of which is shown in FIG. 1A, are used. The electronic circuit generates a medium-high frequency signal (kHz-MHz) using active components and a resonance network (coil-condenser). The amplifier can be implemented by a field-effect transistor, a bipolar transistor or by an operational amplifier.

Starting from the structure shown in FIG. 1A, the two basic topologies deriving from the oscillator in FIG. 1A, such as the Colpitts oscillator shown in FIG. 1B and the Hartley oscillator (U.S. Pat. Nos. 1,356,763, 2,556,296) shown in FIG. 1C, are known. In these LC tank circuits, the quality, or Q, factors are relatively low, enabling the resonant tank circuit to oscillate over a wide range of frequencies. Another known typology of circuit is the Armstrong LC-type oscillator (U.S. Ser. No. 11/131,149, DE291604) shown in FIG. 1D. However, with regard to these classic topologies, the design and implementation of an oscillator circuit that minimises the parasitic capacities generated by the circuit itself, and by the electrode or antenna that generates and receives the EM field, is required.

On the other hand, the sensor should be operative within a wireless sensor network. To this effect, it is necessary that the wireless technology used should be suitable for low-consumption and low-data-transfer rate at the same time as achieving a high level of reliability and security in the communications that enable its integration with other types of sensors, such as optical sensors, CCD sensors or any other type of sensors.

Document WO9741458 describes a quasi-electrostatic detection system that surrounds an electrically conductive mass with an electric field the magnitude of which is detected in one or more locations to analyse a property of interest with respect to the mass. The object intercepts a part of the electric field that extends between the "emitter" electrode coupled to a CA and the other "receiver" electrodes, the amount of the field intercepted according to the size and orientation of the mass detected, regardless of whether or not the mass provides an earth connection pathway, and the geometry of the electrodes distributed. Due to the response of the field to an object being a complex non-linear function, the addition of electrodes can always be distinguished among other cases. In other words, each electrode represents an independent weighting of the mass within the field; adding an electrode provides information with respect to that mass which is not redundant for the information provided by the other electrodes.

Document WO03022641 describes a device for detecting the size and location of an occupant of a vehicle which includes a conductor that is electrically coupled to a voltage signal generator and fitted inside the vehicle seat. The conductor generates a periodic electric field. A plurality of electrostatic sensor antennae is fitted adjacent to the roof and can detect at least one part of the electric field. A detection circuit determines the size and location of a vehicle occupant based on an incidental quantity of electric field in each electrostatic antenna of the sensor.

Document US2004090234 describes well-logging devices and methods for determining the resistivity of the formation to multiple (>3) research depths. At least one transmitter antenna and at least two receiver antennae which are mounted in a logging tool casing, in a substantially common axis. The antennae are untuned wire coils. The electromagnetic energy is emitted at multiple frequencies from the transmitter to the formation. The receiver's antennae, which are separated from each other and from the transmitter, detect the electromagnetic energy reflected.

Finally, document EP256805 describes a sensor comprising an analysis and control circuit and a reference electrode coupled to the analysis and control circuit. The electrode sensor of a capacitive sensor is coupled to said analysis and control circuit. The capacitive sensor is adapted to detect the proximity of an object. The analysis and control circuit of the sensor is designed so that the capacitance data detected between the sensor electrode and the reference electrode are variable to the potential of an objective electrode by means of an analysis and control circuit of the sensor.

The above documents display the particularity of being configured by means of an emitter-receiver structure, in other words, that there is an electrode that emits and an electrode that receives a signal, and so the disruptions between said emitter and said receiver are measured. Meanwhile, this presents a certain complexity in the circuitry. Furthermore, it does not permit the emission of the magnetic field to be controlled since the dispersion in the emitter is not defined in a determined direction so that it does not restrict its use and application to very specific cases wherein it is possible to implement or use both emitters and receivers.

Document EP2980609 describes a sensor capable of measuring electrostatic fields and their variations to determine human presence in an area close to and surrounding said probe and differentiate it from any other animal or object. The electrostatic fields sensor, whose signals are uncoupled from each other by means of an uncoupling circuit, and wherein said circuits for measuring electrostatic fields are connected to an antenna consisting of a coaxial cable by means of a phase measurement circuit. This invention shares the same technical objective and resolves the same technical problems as this document, albeit with an alternative and different solution.

Other documents from the same applicant as patent EP2980609 reflect solutions based on the same technology and physical properties such as documents EP3190569, EP3076206, WO2017077165 and WO2017070166.

This invention, just like document EP280609, is based on the measurement of the variation of a controlled magnetic field surrounding a conductor that acts like a probe or antenna when said body is affected by the influence of a charged body such as the human body. In other words, that the human body, just like any other existent body, presents intrinsic electrical characteristics, dependent on the materials, density, volume, temperature and conductivity. Potential differences between the different objects give rise to electrostatic discharges from one object to another when they come into contact or are infinitesimally close. This effect is exploited by the sensor that is the object of this invention, managing to measure continuously the fluctuations that said field cause in a circuit connected to the conductor that acts like an antenna. Notwithstanding, this invention describes a series of improvements to the technology described in the state of the art as will be described in detail in this document.

SUMMARY OF THE INVENTION

The object of this invention is a device comprising a controlled magnetic fields sensor with which it is possible to detect the presence of any nearby object by means of the detection of the disruption in a magnetic field around a sole conductor which is configured as an antenna that emits a controlled magnetic field and, at the same time, detects the variation or disruption to said field. All this according to the device described in claim 1. In the depending claims to it, specific embodiments of the device of the invention are described. Other aspects of the invention are described in independent embodiments.

One of the virtues of this invention is that it is capable of emitting the electromagnetic field in a controlled way by means of an active screening by means of a high impedance circuit so that, by means of the only conductive element comprising the emitter-receiver antenna, it is possible to direct the magnetic field towards a determined zone of influence and configurable for each specific application as will be described subsequently in this document.

Thanks to this structure, the device is capable of distinguishing, as a function of the magnitude of the change—i.e., the disruption generated—if there is a person, an animal or any other object, since the invention is based on the device's capacity to measure the variations of the magnetic field existent around each one of the antennae the device is connected to, since the device can be connected to various antennae, with the particularity that each one of the antennae acts independently with respect to the others, in other words, each antenna has the same capabilities and functionalities in the detection of the disruption—it emits a controlled magnetic field and, at the same time, detects disruptions to this field-.

The device's operating principle is simple. The device essentially comprises an oscillator circuit that generates a sine wave (alternating current) and whose output is connected to at least one antenna like those indicated. Meanwhile, the circuit has the particularity of being a closed loop since the signal from the antenna is, at the same time, configured as the input signal from the oscillator circuit. This particular configuration enables the antenna signal to be followed, in other words, when there is a disruption and the magnitude of the field changes, this change will immediately affect the input of the oscillator circuit, thereby significantly increasing the sensitivity of the device and, furthermore, makes the traditional emitter-receiver configuration described in the state of the art unnecessary. Another important benefit is that said configuration is not affected by external noise since the closed-loop configuration logically cancels out any noise that may exist in the signal. This closed-loop configuration, already described in document EP2980609 from the same applicant, is significantly improved in its sensitivity and response with the circuit and configuration described in this invention.

Thus, this invention, just like document EP2980609 starts from the fact that, the human body, just like any other existent object, displays its own electrical characteristics, dependent on the materials, density, volume, temperature and conductivity. The differences of potential between different objects give rise to a plurality of electrostatic interactions from one object to another when they enter into contact or are nearby. This effect generates fluctuations in the magnetic field surrounding the antenna, which are continuously measured by the device. To be precise, the measurement of this signal from the antenna due to a disruption—i.e., the measurement of the change in the antenna's impedance due to a disruption—in turn shapes the controlled magnetic field surrounding the antenna and enables it to be determined, according to the change caused, which object has caused said disruption—person, animal or thing-.

More specifically, the device for measuring disruptions in a controlled magnetic field and generated by the device itself surrounding a sole conductive element, antenna or electrode comprising, at least: a controlled magnetic fields device comprising, in turn: an oscillator circuit connected to at least one electrode, a digital module; and a processor connected to the digital module; wherein said measurement device is characterised because: the oscillator is connected to a transformer whose secondary is connected to the electrode and whose primary is connected to the active element of the oscillator; the oscillator comprises a feedback network and a polarisation network configured to polarise the input transistors of the active element of the oscillator; and wherein, moreover, the signal generated by the active element of the oscillator generates a controlled magnetic field in the electrode and this same signal recharges the input of the active element of the oscillator by means of the feedback network; so that the same signal that recharges the input of the active element of the oscillator is processed digitally in the digital module to be acquired by the processor.

The applications of the device that is the object of the invention are all those requiring the detection of an object prior to it resulting in the violation of the restricted space. Amongst these applications we can highlight the following: the localisation of people, domestic and industrial security applications, robotics, military applications and security applications for transporting cargo and people, work-related and domestic prevention and security applications and applications for the logistics sector.

The device applied to security systems in industrial installations involves notifying a specific user or operator that he/she is approaching a determined restricted or unauthorised zone. This enables—for example, in the operational zone of a robot arm, for it to be paralysed when an operator is within its operating range, regardless of whether the operator him/herself is subsequently called upon to explain if he/she were not authorised to be there, for which purpose the system can also identify the operator.

Also object of the invention is an access control in restricted areas comprising at least one of the following: a virtual fence, a crossings detector in sensitive, restricted or dangerous zones such as railway platforms or loading docks for land or maritime transport, as well as safety in the use of domestic appliances; or a combination of the above.

The virtual fence or crossings detector comprises, at least, a device according to this invention, with the particularity of having a plurality of antennae configured to delimit a determined work or transit area, so that any object, person or animal that affects, at least, one generated field in, at least, one of the antennae, generates an alarm, a notification or similar. It is also intended that said signal might activate physical closure element—for example, the automatic closing of a door or physical barrier-.

Similarly, the device of this invention can be used in the surveillance and control of railway platforms, loading docks for land or maritime transport, access to safes, monitoring exhibitions of valuable objects, such as works of art, and safety control in the use of domestic appliances.

In all the above cases, the antenna or antennae delimit a determined control area or restricted use zone, so that any object, person or animal that generates a disruption in at least one antenna connected to at least one device will generate an alarm, a notification, or similar. It is also intended that said signal might activate physical closure element—for example, the automatic closing of a door or physical barrier-.

Also, an object of this invention is a detector of objects adhered to a vehicle by means of the detection of the approach of the person and/or the characterisation of the foreign element. In a second aspect of this use, it is configured as a security element inside vehicles, for example, in the detection of the correct position of security anchors or the detection of people in bathrooms, cellars or restricted areas of the vehicles themselves, such as the driver's cab. Finally, the security system is capable of precisely detecting the position of the vehicle in a car park or parking area.

Another object of the invention is its use as a weapons and explosives detector and a method for the detection of weapons and explosives. More specifically, this invention refers to the detection of IEDs (Improvised Explosive Devices) in the passage of vehicles, the detection of limpet bombs, the detection of land mines or the detection of weapons, by means of the detection of the approach of the person or characterisation of a foreign element that may, in itself, be deemed a threat.

Lastly, a final use in domestic security applications, conferring the capacity of preventive detection of intruders to doors, windows, walls or, in general, any other architectonic enclosure, in other words, the device of the invention is used for the detection of the intrusion before it takes place, precisely thanks to its capacity to measure the disruptions at distance.

The scope of this invention is defined by the claims, which are incorporated in this section for reference. Throughout the description and the claims, the word «comprises», and its variants does not intend to exclude other technical characteristics, components or steps. For those skilled in the art, other objects, benefits and characteristics of the invention will emanate partly from the description and partly from using the invention. The following examples of use and associated figures are provided for illustrative purposes and are non-limiting. Furthermore, this invention covers all the possible combinations of the preferred embodiments indicated here.

BRIEF DESCRIPTION OF THE DRAWINGS

Below follows a brief description of a series of drawings and diagrams which help to understand the invention better and which expressly relate to an embodiment of said invention which is presented as a non-limiting example of it.

FIG. 4 shows a diagram of the oscillator circuit screening at the input of the sensor of the invention.

DETAILED DESCRIPTION OF ONE EMBODIMENT OF THE INVENTION

Figure 1A:
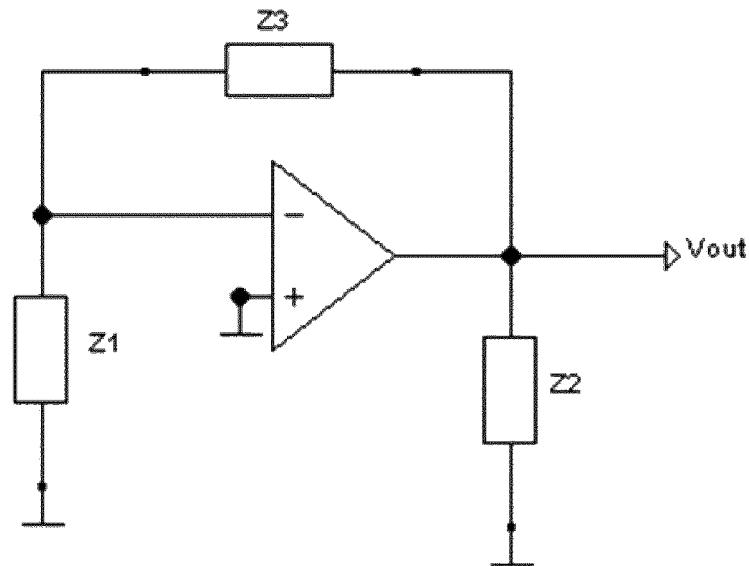
FIG. 1 shows different typologies of oscillators known in the state of the art of the CMF sensors that are the object of this invention.
Figure 1B:
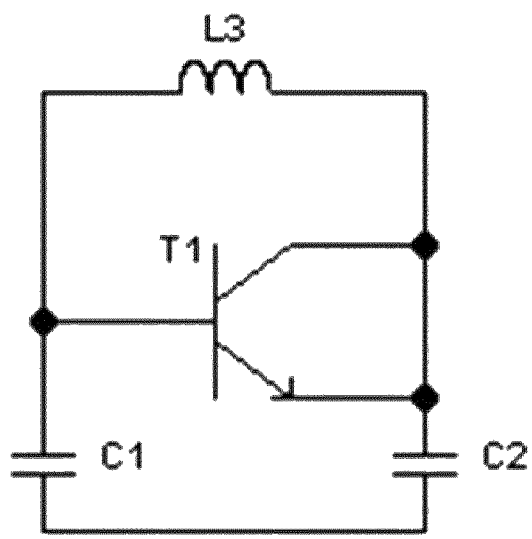
Figure 1C:
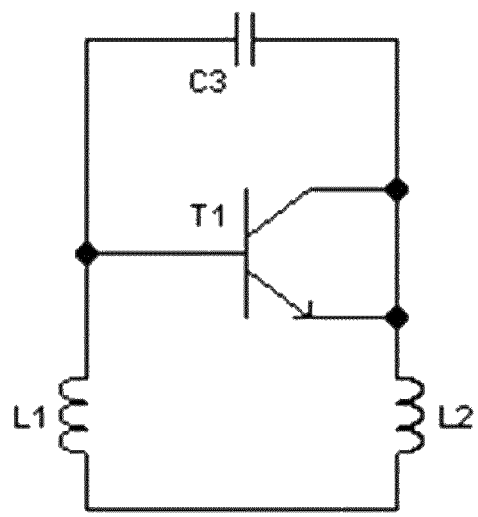
Figure 1D:
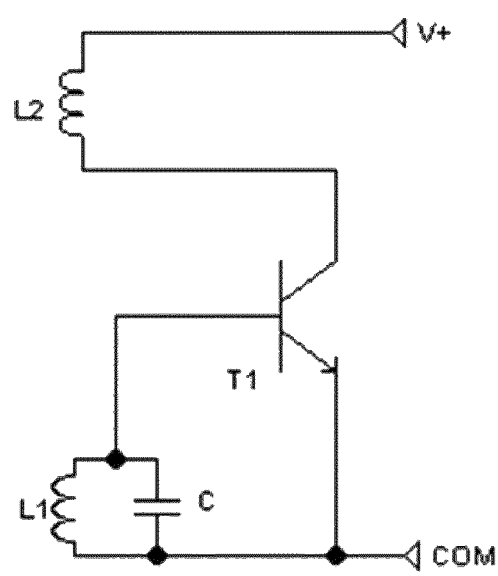

The different aspects of the invention comprise a controlled magnetic field sensor capable of detecting a disruption in the magnetic field surrounding a sole conductor or antenna that has the particularity of emitting a controlled magnetic field and, at the same time, detecting any disruption in said field so that, by means of the characterisation of said disruption, it is possible to detect and discern the object that generated said disruption.

In this description, the terms «circuit» and «circuitry» refer to the electronic physical components—i.e., hardware components- and any software and/or firmware—machine code—that can configure or be susceptible to configuring the hardware and/or be associated in any way with the hardware. In certain parts of the description, hardware and software may be abbreviated to HW and SW respectively.

With reference to the enclosed figures, a sensor CMF 100 is shown, which is a mixed analogue-digital sensor comprising an oscillator 102 connected to, at least, one antenna 101 embodied in a sole conductive element which is configured to emit an electromagnetic field and which, in turn, is an EM field emitter and a receiver of said EM field, being capable of receiving and detecting the disruptions generated in said field due to the presence of one that is converted into a square wave and digitalised for its subsequent analysis as will be described below.

Throughout this description, the expressions «antenna», «conductor» and «electrode» refer to the same physical element, i.e., an electrical conductor referenced as (101) and whose equivalent circuit is a capacity condenser that is variable as a function of the presence of an object, person or animal that disrupts the controlled magnetic field generated by the oscillator 102 surrounding the antenna or electrode 101.

One of the key points of the invention is that the controlled magnetic field (CMF) is directable by means of an active gatekeeper, as shown in FIG. 4. To this effect, a high impedance element is implemented—in the embodiment shown in FIG. 4, an operational amplifier-. The sensor 100 and the electrode 101 are connected to the input of the device. As can be seen, the output of the device is earthed, so there is a very high impedance at the input (of the order of 100 MΩ) and a low impedance at the output (of the order of 5/10Ω), which causes the lines of the field to be emitted in just one direction.

The oscillator 102 is configured to minimise the parasitic capacities generated by the circuit itself and by the electrode 101 and which guarantees a continuous oscillation of the sine wave. Notwithstanding, when the design of the oscillator 102 has to be implemented within a chip and in CMOS technology, the parasitic effects of the transformer (L1, L2) as well as the parasitic capacities and parasitic resistances themselves of an integrated design were evaluated, taking into account that the transformer (L1, L2) is directly connected to a pad of the chip, as shown better in FIG. 2B.

For the design of the active element of the oscillator it is possible to implement three different topologies of amplifier: telescopic, folded-cascode and a two-stage one, all being typologies known for delivering high gains in an open loop. In other words, any topology that delivers high gains in an open loop is susceptible to be used in the sensor of this invention.

Notwithstanding the foregoing, the two-stage topology is the one that delivers highest gains but also needs a higher compensation and its power consumption is higher. Although adequate, its high-power consumption rules it out for this application since each sensor 100 node must have a high autonomy of use.

From the other two options, the telescopic configuration has been chosen as a preferred, but non-limiting, embodiment because it consumes less power, achieves higher gains and has parasitic poles at very high frequencies. On the other hand, it has been established that, for the detection of people, the sine wave voltage at this point is between 2-200 volts peak-to-peak (Vpp). The feedback of this point is connected to the MOS ($M_{IN}$) transistor gate of the active element (i.e. the operational amplifier in telescopic configuration) and the maximum voltage that an MOS transistor can withstand is around 7V, for which the circuit shown in FIG. 2B is used, as previously indicated.

Figure 2A:
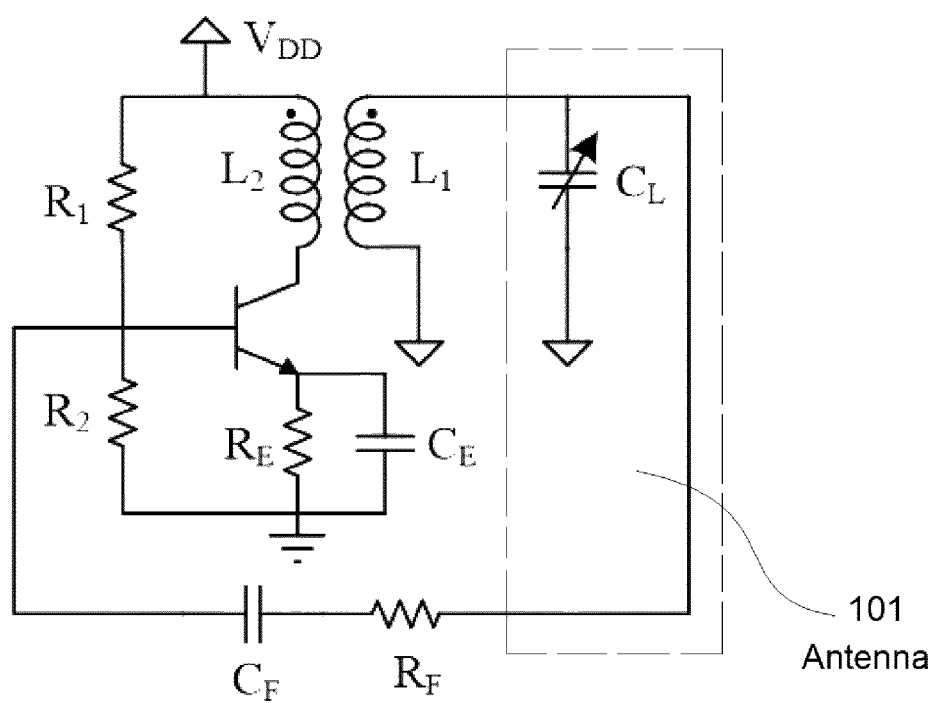
FIG. 2 shows two typologies of oscillator circuits that implement a CMF sensor that is the object of this invention.
Figure 2B:
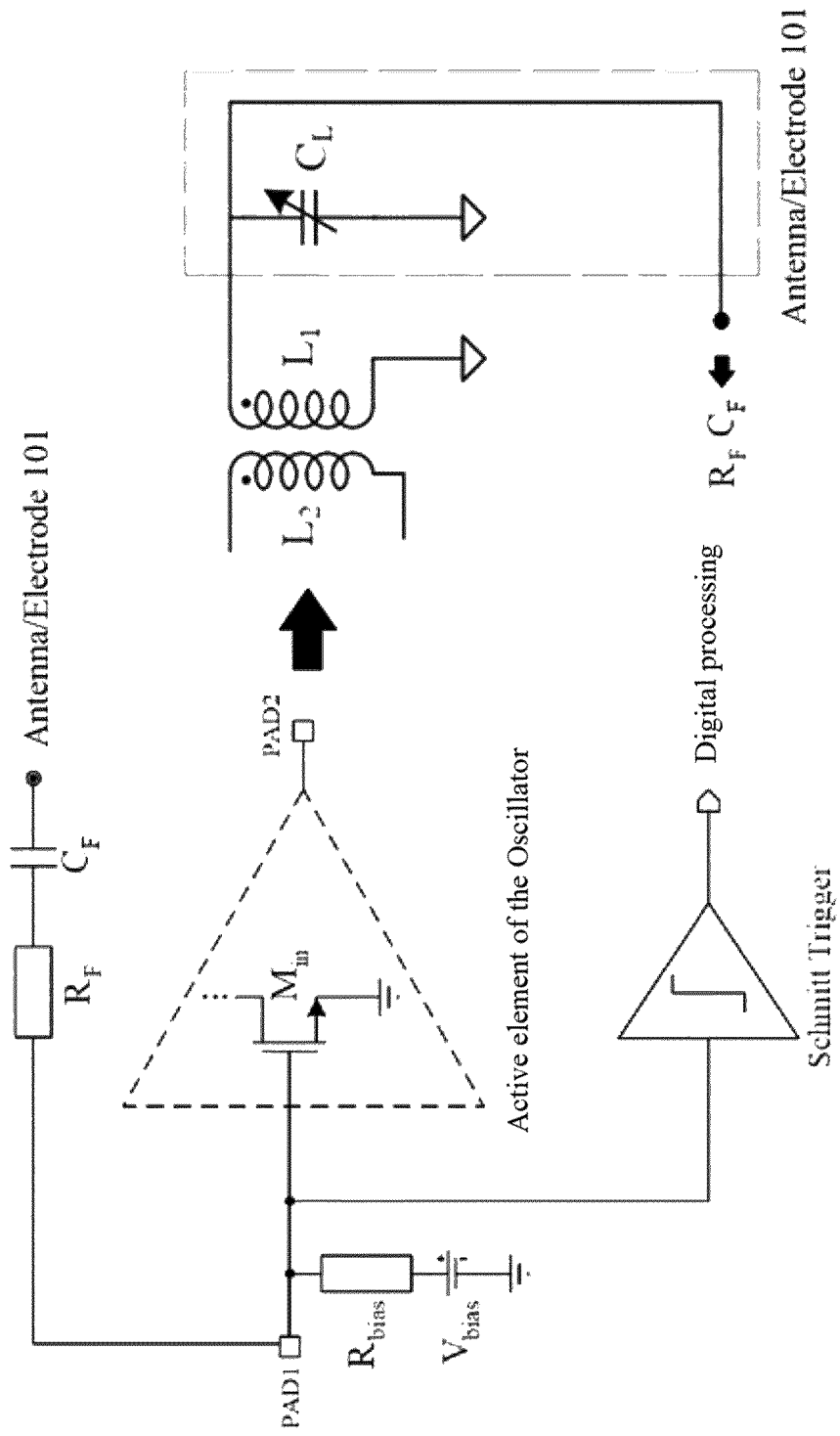

Another technical problem resolved by the circuit shown in FIG. 2B was that the sine wave signal of 2-200 Vpp must be converted to the digital domain transmitting the squared sine wave signal. To this effect, a Schmitt-Trigger-type comparator configured like a CMOS inverter chain which can be integrated into the chip itself has been used.

Hence, for the integration of the oscillator 102, the feedback network ($R_F$, $C_F$) of the oscillator 102 circuit has been modified to manage the signals from tens of volts generated in the electrode 101 within the integrated circuit—the chip. To this effect, regarding the basic diagram of the oscillator 102 shown in FIG. 2A, the $R_{BIAS}$ resistance and the $V_{BIAS}$ polarisation voltage have been included. The $R_{BIAS}$ resistance, along with the $R_F$ resistance, form a voltage divider that mitigates the oscillation at the input to the active element and which, moreover, along with the $V_{BIAS}$ voltage, ensures that negative voltages, which may endanger the integration of the circuit, are not reached. On the other hand, the fact that the integrated circuit is designed in CMOS technology enables the $R_{BIAS}$ resistance and the $V_{BIAS}$ voltage also to be used to adequately polarise the ($M_{IN}$) input transistor of the active element of the oscillator 102. The mitigated sine wave signal at the input of said active element can be converted into a low voltage feedback environment within the integrated circuit itself in a squared signal for its subsequent digital processing.

Finally, to complete the design, it was decided that the polarisation voltage of the ($V_{BIAS}$) oscillator should be 5V—but in a non-limiting way, since other values can be adopted according to the technology implemented for the physical embodiment of the device—so that around 5V of maximum sine wave voltage reaches the gate of the ($M_{IN}$) input transistor of the operational amplifier, so that, along with the appropriate relationship of transformer coils, the required voltage of 2-200 Vpp is generated in the secondary (L2).

With this structure it is possible to reach consumptions of the—non-limiting—order of between 7 mA and 0.1 mA. To increase the level of integration, the polarisation resistance ($R_{BIAS}$) in the input of the telescopic amplifier is also included within the integrated circuit. Logically, at lower consumption, the gain of the amplifier is reduced and the oscillation condition may be lost and it has been proved that, with load capacities in the electrode 101 of between 1 pF and 10 nF, oscillation frequencies between 5 kHz and 2 MHz are generated with amplitudes of between 2-200 Vpp, detecting capacity variations of 0.01 pF, which supposes a frequency change detectable by the circuit. As reiterated previously, these numerical examples have a purely illustrative and non-limiting value in the operation and benefits of this invention.

Once the analogue part of the sensor CMF 100 has been explained, the digital part of the sensor or digital module 103 is described. That is to say, once the analogue part provides sufficient amplitude voltage to the electrode 101 to generate the EM field (2-200 Vpp) and the inverters have generated a squared signal typically of between 0-5 V—this value, likewise non-limiting, will depend on the final technology used in the physical embodiment of the device—the latter being the signal that should be processed in the digital domain to extract the information of interest.

Figure 3:
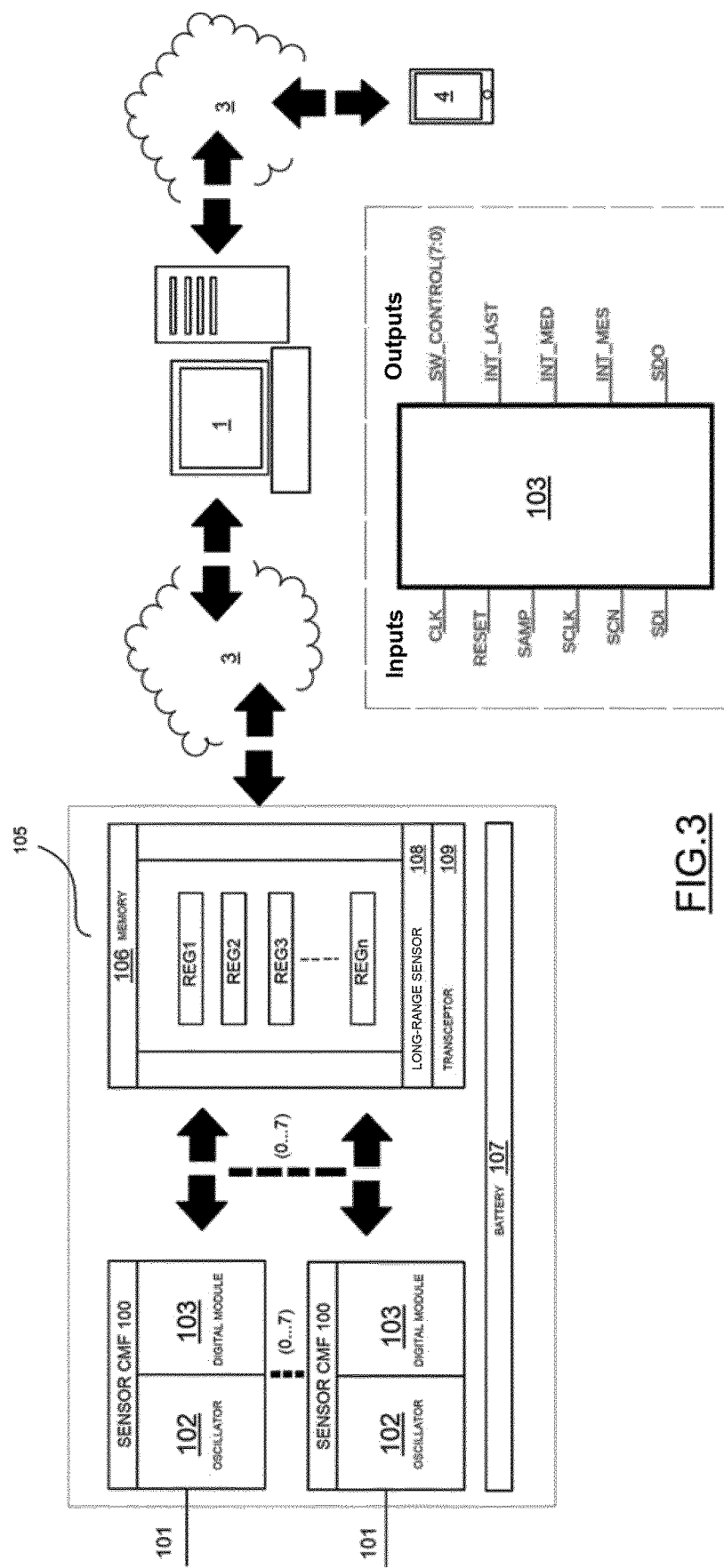
FIG. 3 shows a block diagram of the complete data-measurement system including the CMF sensor that is the object of this invention.

The circuit in the digital domain 103 is configured to connect to the processor 105 by means of an SPI port (Serial Port Interface, described in technical note TN0897 Technical Note ST SPI Protocol) in slave mode. FIG. 3 shows the block diagram of the digital circuit 103 of the sensor CMF 100.

At this point it is interesting to highlight, as can be seen in FIG. 3, that the device of the invention is configured in a embodiment, as a matrix of sensors 100 with 8 channels (i.e. eight sensors 100 each connected to at least one electrode 101). This configuration enables the device to undertake the measurement of the controlled magnetic field in differential format, each sensor 100 acts in parallel, so that one of the channels can be used as a gatekeeper against noise.

Notwithstanding, the matrices—the sensors 100 configured in the form of a matrix within the ASIC integrated circuit—have cross-talking problems due to their physical proximity. To avoid this effect, the device of the invention implements an internal and external synchronisation mechanism of the measurement of the sensors 100 whereby: (a) the sensors 100 that are in closest physical proximity measure further in time between themselves—their measurement cycles or periods are more separated from each other-; and (b) the sensors 100 that are further away physically have closer measurement periods between themselves—their measurement cycles are closer-.

Another important benefit of the device of the invention, shown in FIG. 3, is that it is possible to not work continuously, but by storing everything in a buffer so that energy can be saved because all the data remain stored in the buffer can be analysed a posteriori, and not necessarily continuously. Furthermore, as we shall see below, all the parameters are programmable.

In this aspect, the sensor 100 comprises, in turn, the following input-output blocks or modules: (a) a first communications module series with the processor 105 that includes: (a.1) a clock input signal synchronised to the SPI in slave mode (SCK); (a.2) SDO series output to the processor 105; (a.3) SDI series input of the processor 105 to the sensor CMF 100; and (a.4) selection signal of the sensor CMF 100; (b) an interruption signals module comprising: (b.1) an interruption indicating that an INT_MES measurement has just been made. It can be used to connect a plurality of sensors CMF 100 in series; (b.2) an interruption indicating that the difference between the current and the last measurement has exceeded a threshold configured INT_LAST; (b.3) an interruption indicating that the difference between the current and the last measurements has exceeded the threshold—given that the number of measurements to calculate the average is configurable-; (c) an electrode 101 selection module that is configured like an 8-coded bits output signal which activates the switch that selects the measurement electrode 101. As previously indicated, each sensor CMF 100 is capable of being connected to one of the electrodes 101 that would be configured as an EM field emitter-receiver antenna.

The SAMP signal is an input used as an initial sampling signal. This signal uses an internal register with a time period configured not to overlap the measurements of the different devices and to not cause interferences.

The sensor CMF 100 is internally configured to establish the sampling frequency and to determine whether the transitional has passed, two registers are activated: If the previous and current sample are differentiated in a lower, or epsilon value the transitional is deemed to be passed and the measurement begins; and/or by specifying the establishment time to determine that the signal from the electrode 101 is stable.

Finally, the sensor CMF 100 is configured to record, on the one hand, the last measurement, indicating its electrode 101 of origin and, on the other hand, comprises up to 64 registers with the last measurements wherein the registers can always be accessed in the same direction, like a circular stack. In light of successive readings, the system will return the samples, starting with the most recent until the queue is cleared. For each measurement, the measurement electrode is identified.

The sensor CMF 100 is connected wirelessly to a management system 1 that is configured as a computer or central processing unit that can either be integrated into one sole device or be a distributed system. An integrated system may comprise, for example, a sole computer or central processing unit (CPU), server, electronic machine or device, in which the integrated system can be configured to perform some or all the functions or characteristics of management system 1, as described in this document. A distributed system can be implemented with a plurality of interconnected components, preferably wirelessly, and wherein each component is configured to carry out all or some of the functions, characteristics and/or operation of management system 1.

In an example embodiment, management system 1 implements one or more nodes, embodied in one or more master-type controllers to control one or more sensors CMF 100. A master controller may also comprise, for example, a remote controller.

Although FIG. 3 refers to a unique management system 1, logically, the description is not limited to just one embodiment. For example, there may be several management systems 1 connected between themselves by means of a data network 3 so that it is possible to cover much larger spaces with just one management system 1.

Communications between the sensor CMF 100 and the management system 1 are essentially wireless and may comprise different links and/or protocols such as, for example, Bluetooth, ZigBee, Bluetooth LE, Smart Bluetooth, iBeacon, near-field communication (NFC) protocols or WLAN WIFI (protocols 802.11) or any other wireless link or suitable protocols for the interchange of data between the management system 1 and the sensor or sensors CMF 100. For one skilled in the art, it is evident that, despite wireless communication being the preferred option in a multitude of applications, communication between the sensor or sensors CMF 100 and the management system or systems 1 can be by means of physical cabled communication.

The management system 1 can also communicate with at least one user terminal 4 by means of the data network 3. Communication can be direct or by means of an external service server, for example, in certain cases or applications, an alarm centre, the result being in any case the same, which is no different from communicating the incidences measured by the sensor CMF 100 to the owner of user terminal 4. This user terminal is a mobile phone, tablet or personal computer and, in general, any electronic device capable of receiving and interpreting the data originating from management system 1 by means of data network 3, or a mobile phone network or a combination of both.

Furthermore, the sensor CMF 100 can define its own position by means of, for example, GPS, IPS and/or micromapping and/or based on a reference position defined in management system 1. For example, if the sensor CMF 100 moves from the desired position, a notification will be sent to the management system and, thus, to user terminal 4 by means of data network 3. Similarly, the detection of any disruption to the magnetic field surrounding at least one sensor CMF 100 may generate an order from management system 1 or from user terminal 4 in order to generate a required action according to each case and specific application, as will be explained for each specific use of this invention.

The sensor CMF 100 comprises a programme or programmes that are stored in the memory 106 and configured to be executed by one or more processors 105. The programmes comprise instructions to execute the functionalities previously described. The memory 106 can store, for example, configuration data that may comprise parameters and/or code comprising software and/or firmware. The memory 106 may comprise different memory technologies, including, for example, read-only memory (ROM), programmable ROM and electronically-erasable EEPROM, random-access memory (RAM), low-latency non-volatile memory, flash memory, solid-state drive (SSD), field-programmable gate array (FPGA) and/or other means of electronic data storage capable of storing data, code and/or other information.

The memory 106 can be used to store the processed data generated by the electrode 101. The memory 106 can also be used for storing information, such as configuration information, that can be used for controlling the operation of the sensor CMF 100. For example, the memory 106 may comprise information required to configure the wireless transceiver to enable the reception of RF signals in the appropriate frequency band and the desired communications protocol.

In one example embodiment, the sensor CMF 100 may be operable to receive software and/or firmware updates which could be stored in a memory (for example, the memory 106). For example, the sensor CMF 100 can receive software and/or firmware updates from a network manager (for example, management system 1). In one example embodiment of the dissemination of the software and/or hardware updates that can be received, processed and/or installed manually or automatically. For example, the process can be completely automatic (for example, a network administrator may send an update to the sensor CMF 100), and/or semi-automatic (for example, an update may be initiated by a user by means of, for example, user terminal 4).

The battery 107 may comprise a replaceable battery inside the sensor CMF 100 to provide energy, or as back-up power when DC input voltage is used. The sensor CMF 100 can take measurements of the sensors and/or communicate with other lower frequency devices when powered by the battery 107 and can only detect/communicate continuously when an external DC power source is used, thus achieving energy savings.

The wireless long-range sensor 108 may comprise the logic or appropriate circuits to for example, determine whether the sensor CMF 100 is within range of a management system 1. To this effect, the wireless long-range sensor may be operable to generate an alarm condition when the sensor CMF 100 is not within range of management system 3. In an example embodiment, if the sensor CMF 100 is out of range, it can generate a luminous signal in the luminous indicators or an acoustic signal in an acoustic indicator.

The sensor CMF 100 comprises a wireless transceiver 109, which may comprise the appropriate circuits and logic for the communication by means of one or more wireless communications protocols, such as Z-Wave, IEEE 802.11x, Bluetooth, and ZigBee. The wireless transceiver 109 may therefore comprise RF transmission media, the amplification, the demodulation/modulation and other circuits for the transmission and reception of signals. Furthermore, the wireless transceiver 109 can be used to provide software/firmware updates for the sensor CMF 100.

As previously indicated, the sensor CMF 100 comprises a programme or programmes stored in the memory 106 and configured to be executed by means of one or more processors 105. The programmes comprise instructions to execute the functionality of the device described.

As the case may be, various means of embodiment provided by this description may be implemented using hardware, software, or combinations of hardware and software. As also may be the case, the different components of hardware and/or software established in this document may be combined in composite materials comprising software, hardware and/or both, without deviating from the object of this invention defined by its claims. The different components of hardware and/or software established in this document can be separated in the sub-components comprising software, hardware, or both, without deviating from the object of this invention defined by its claims. As also may be the case, it is considered that the software components can be used as hardware components and vice versa.

The software according to this description, such as non-transitory instructions, programme and/or data, code, can be stored in one or more legible means of the non-transitory machine. It is also considered that the software identified in this document can be implemented using one or more general-purpose, or specific-purpose, computers and/or computer systems, in a network and/or of another type. The order of the different steps described in this document can be changed and/or divided into substages to deliver the characteristics described in this document.

The means of embodiment described above illustrate, but do not limit, the invention. It should also be understood that numerous modifications and variations are possible according to the object of this invention. Consequently, the scope of the invention is only defined by the following claims.

The invention claimed is:

1. A device for measuring disruptions in a controlled magnetic field and generated by the device itself surrounding a sole conductive element, antenna or electrode and comprising:
    a controlled magnetic field sensor connected in a closed loop to the electrode comprising:
        an oscillator circuit connected to the electrode;
        a digital module; and
        a processor connected to the digital module;
    wherein an output signal of an active element of the oscillator circuit is connected to a primary winding ($L_2$) of a transformer ($L_1$, $L_2$) whereas a signal at the electrode which is connected to a secondary winding ($L_1$) of the transformer ($L_1$, $L_2$) is further connected to an input ($M_{IN}$) of the active element of the oscillator circuit via a feedback network ($R_F$, $C_F$); and wherein the oscillator circuit comprises a polarisation network ($R_{BIAS}$, $V_{BIAS}$) configured to polarise, at least, one input transistor ($M_{IN}$) of the active element of the oscillator circuit;
    wherein the output signal generated by the active element of the oscillator circuit generates a controlled magnetic field in the electrode and this signal feedbacks the input ($M_{IN}$) of the active element of the oscillator circuit by means of the feedback network ($R_F$, $C_F$), and
    wherein the digital module is connected to the input ($M_{IN}$) of the active element of the oscillator circuit and arranged to digitally process the signal that recharges the input ($M_{IN}$) of the active element of the oscillator circuit such that the signal can be acquired by the processor.

2. The device for measuring disruptions in a controlled magnetic field of claim 1 wherein the active element is of a topology that delivers high gains in an open loop through integration with a selected technology between: telescopic, folded-cascode and two-stage.

3. The device for measuring disruptions in a controlled magnetic field of claim 1 wherein the signal that recharges the input ($M_{IN}$) of the active element of the oscillator circuit is processed digitally by transmitting a sine wave signal to squared signal by means of an adapter circuit.

4. The device for measuring disruptions in a controlled magnetic field of claim 1 which is configured as an integrated circuit that integrates a matrix of controlled magnetic field sensors and implements a synchronisation mechanism of the measurement of the sensors of the matrix, whereby: (a) the sensors that are in closest physical proximity have measurement cycles or periods more separated in time; and (b) the sensors that are further away physically have closer measurement time periods between themselves.

5. The device for measuring disruptions in a controlled magnetic field of claim 4 wherein the digital module comprises one input configured that is used as an initial sampling signal (SAMP) wherein this signal uses an internal register with a time period configured so that it does not overlap the measurements of the different sensors and does not cause interferences.

6. The device for measuring disruptions in a controlled magnetic field of claim 1 wherein the digital module comprises, in turn, a measurement buffer where all the measurements taken by at least one sensor during a programmable time period are stored.

7. The device for measuring disruptions in a controlled magnetic field of claim 6 wherein the sensor is configured to record, on one hand, the last measurement, indicating its electrode of origin and, on the other hand, comprises up to 64 registers with the last measurements whereby it can access the registers always in the same direction so that, in light of successive readings, the measurements will be returned, starting with the most recent until the queue is cleared.

8. The device for measuring disruptions in a controlled magnetic field of claim 1 wherein the digital module comprises: (a) a communications module in series with the processor, including: (a.1) a clock input signal (SCK); (a.2) a serial output (SDO) to the processor; (a.3) a serial input (SDI) from the processor to the controlled magnetic field sensor; (a.4) a controlled magnetic field sensor selection signal; (b) a module of interruption signals comprising: (b.1) an interruption (INT_MES) indicating that a measurement has just been made and which is configurable to connect to a plurality of controlled magnetic field sensor in series; (b.2) an interruption (INT_LAST) indicating that the difference between the current and the last measurement has exceeded a configured threshold; (b.3) an interruption indicating that the difference between the current and the average of the last measurements has exceeded the threshold, given that the number of measurements to calculate the average is configurable; and (c) an electrode selection module configured as an 8-coded bits output signal that activates a switch which selects a measurement electrode, whereby each sensor is capable of being connected to one of the electrodes that would be configured as an emitter-receiver antenna of the controlled magnetic field.

9. The device for measuring disruptions in a controlled magnetic field of claim 1 whereby the sensor is internally configured to establish the sampling frequency and determine if a transitional period of time has passed, enabling two registers: (a) if the previous and last samples differ by a lower value than an epsilon value it is deemed that the transitional period has passed and the measurement begins; and/or (b) specifying an establishment time to determine if the signal of the electrode is stable.

10. A method of employing the device for measuring disruptions in a controlled magnetic field of claim 1, the method including detecting a localisation of people.

11. A method of employing the device for measuring disruptions in a controlled magnetic field of claim 1, the method including providing security systems in industrial installations, and issuing a warning to a determined user or operative that he/she is approaching a determined restricted or unauthorised zone delimited by at least one antenna which configures a zone of influence of the controlled magnetic field and comprising at least one of the following: a virtual fence, a crossings detector in sensitive, restricted or dangerous zones, such as railway platforms or loading docks for land or maritime transport, as well as safety in the use of domestic appliances; or a combination of the above.

12. A method of employing the device for measuring disruptions in a controlled magnetic field of claim 1 in vehicles, the method comprising: (a) detecting objects adhered to a vehicle, by an approaching person and/or characterisation of a foreign element; or (b) being configured as an internal security of vehicles to detect a position of at least one user; (c) detecting a position of a vehicle in a car park or parking area; or (d) detecting transport of cargo or people.

13. A method of employing the device for measuring disruptions in a controlled magnetic field of claim 1 in the detection of weapons and explosives, the method comprising detecting IEDs in the passage of vehicles, detecting limpet bombs, detecting land mines or weapons, by detecting an approaching person or the characterisation of a foreign element that may be deemed in itself to be a threat.

14. A method of employing the device for measuring disruptions in a controlled magnetic field of claim 1 in domestic security applications the method including, conferring the capacity of preventive detection of intruders to doors, windows, walls or, in general, any other architectonic closure.

\* \* \* \* \*